United States Patent [19]

Mori

[11] 4,246,594
[45] Jan. 20, 1981

[54] LOW CROSSTALK TYPE SWITCHING MATRIX OF MONOLITHIC SEMICONDUCTOR DEVICE

[75] Inventor: Masamichi Mori, Tokorozawa, Japan

[73] Assignee: Nippon Telegraph and Telephone Public Corporation, Tokyo, Japan

[21] Appl. No.: 883,796

[22] Filed: Mar. 6, 1978

[30] Foreign Application Priority Data

Mar. 8, 1977 [JP] Japan .............................. 52-24378

[51] Int. Cl.³ .................. H01L 27/04; B01L 29/74; H01L 29/747; H01L 29/72; H01L 29/72
[52] U.S. Cl. .................................. 357/48; 357/35; 357/38; 357/39; 357/89
[58] Field of Search .................. 357/35, 38, 39, 48

[56] References Cited

U.S. PATENT DOCUMENTS

| | | | |
|---|---|---|---|
| 3,423,650 | 1/1969 | Cohen | 357/48 |
| 3,430,110 | 2/1969 | Goshgarian | 357/48 |
| 3,576,475 | 4/1971 | Kronlage | 357/48 |
| 3,590,345 | 6/1971 | Brewer et al. | 357/48 |
| 3,760,239 | 9/1973 | Hruby et al. | 357/48 |
| 3,878,551 | 4/1975 | Callahan | 357/48 |
| 3,972,061 | 7/1976 | Nelson | 357/48 |
| 3,977,019 | 8/1976 | Matsushita et al. | 357/48 |
| 4,014,718 | 3/1977 | Tomozawa et al. | 357/48 |
| 4,027,325 | 5/1977 | Genesi | 357/48 |
| 4,117,507 | 9/1978 | Pacor | 357/48 |

OTHER PUBLICATIONS

Hartman et al., "A Junction Isolation Technology for Integrating Silicon Controlled Rectifiers . . . " IEEE Int. Electron Devices Meeting (12/76), Tech. Dig. pp. 55-58.
Dennehy, "Non-Latching Integrating Circuits" RCA Technical Note No. 876 (2/71) pp. 1-3.
Hubacher, "Overvoltage Protection in Integrated Circuits" IBM Technical Disclosure Bulletin vol. 14 (1/72) p. 2306.

*Primary Examiner*—Gene M. Munson
*Attorney, Agent, or Firm*—Frishauf, Holtz, Goodman & Woodward

[57] ABSTRACT

The switching matrix with a plurality of individual lateral type PNPN type switching elements is disposed on a one chip silicon. The chip includes a double layered substrate having a thin P type layer with low impurity concentration epitaxial-grown on a P+ type layer with high impurity concentration and an N type layer with low impurity concentration epitaxially grown on the P type layer. The substrate has a low resistance. An N+ type buried layer with high impurity concentration is diffused into the junction between the P type layer and the N type layer at the location where the switching element is to be disposed. The switching element is formed in the N type layer right above the N+ type buried layer. P+ type isolation region with high impurity concentration is diffused into the N type layer, not contacting the N+ type buried layer but the substrate P type layer and enclosing the N type gate region of the switching element. At this time, between adjacent P+ type isolation regions is formed a high resistive separation region of the N type layer. With such a construction, the low resistive P/P+ type double layered substrate and the high resistive N separation layer cooperate to remarkably reduce the signal crosstalk between switching elements.

13 Claims, 24 Drawing Figures

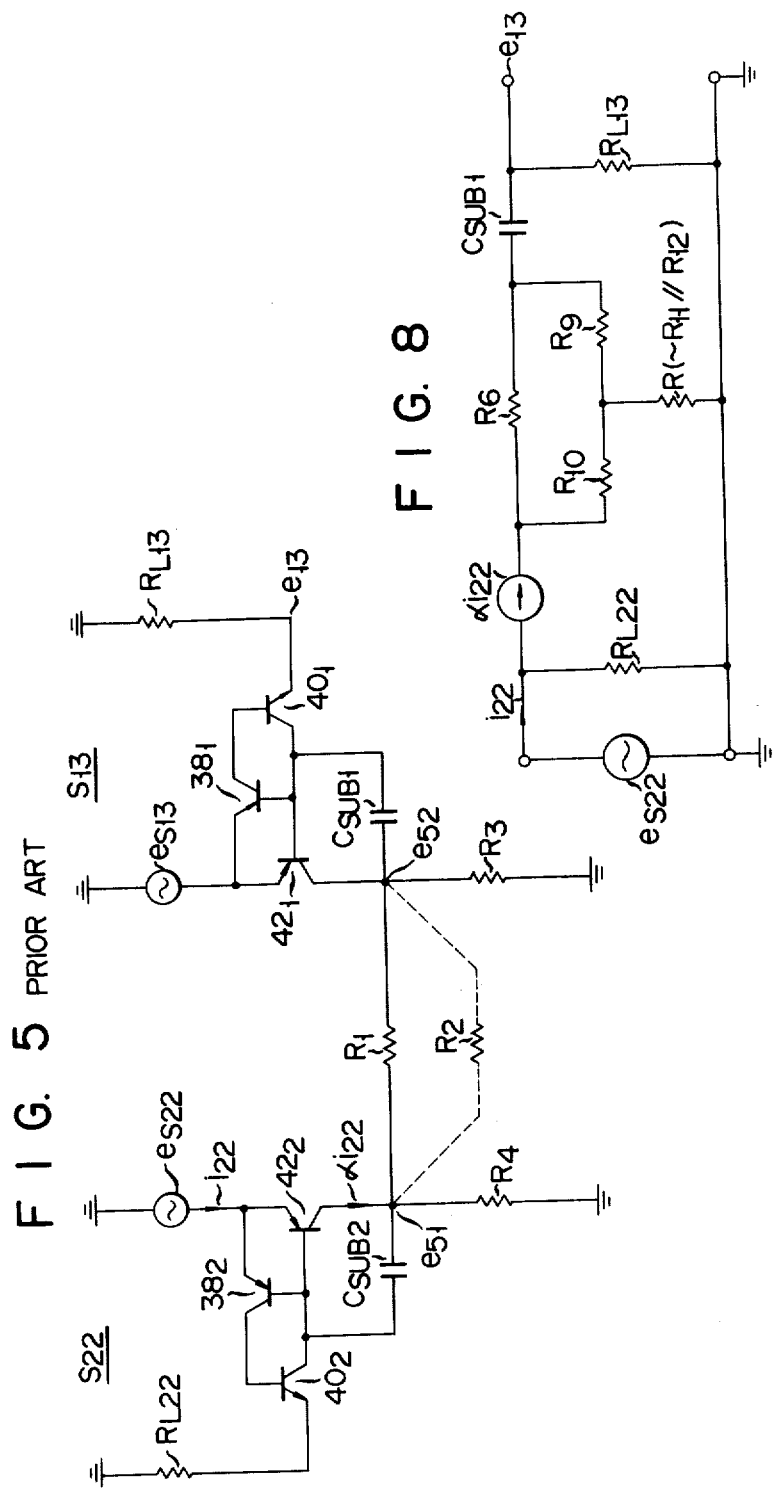

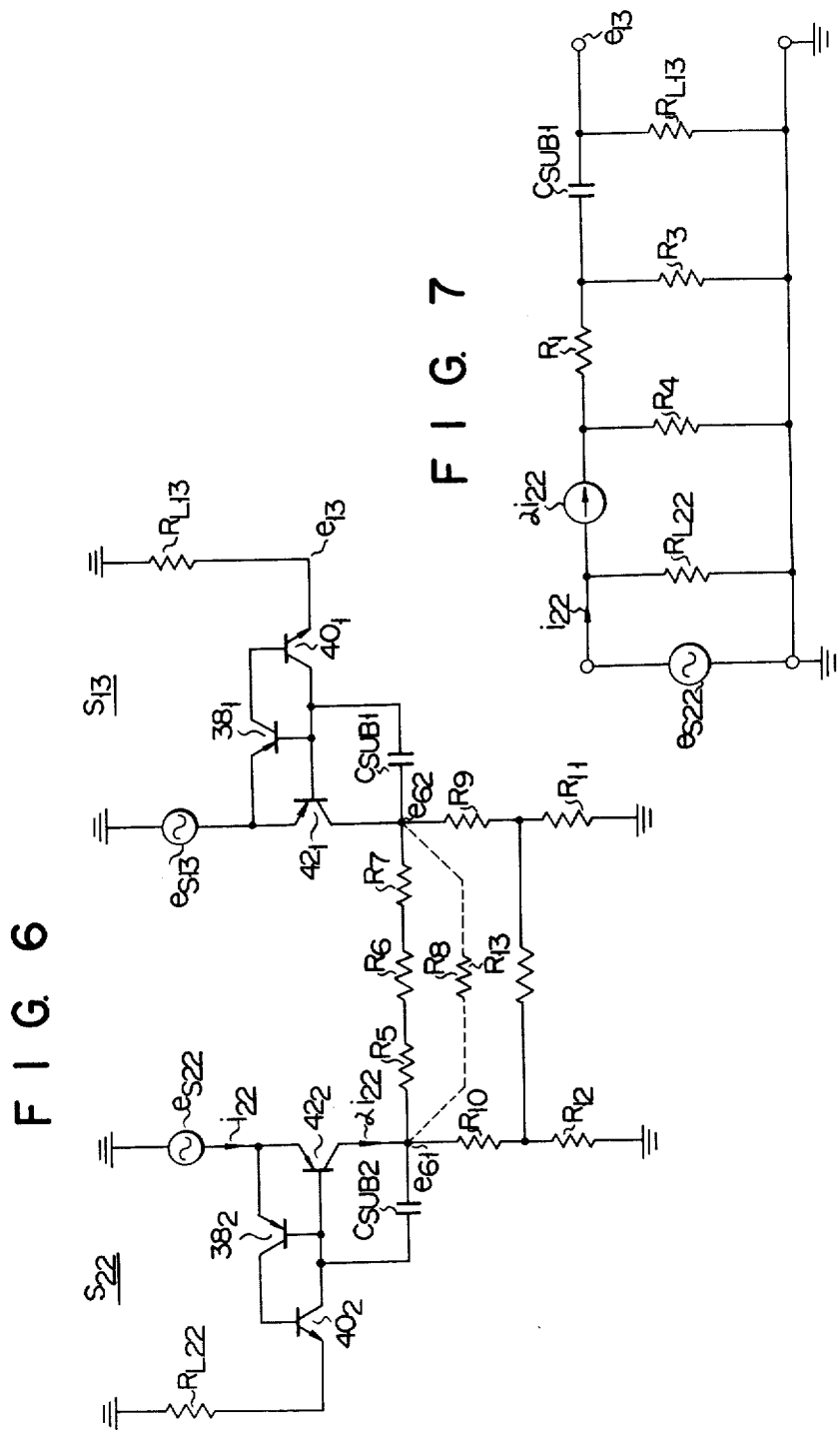

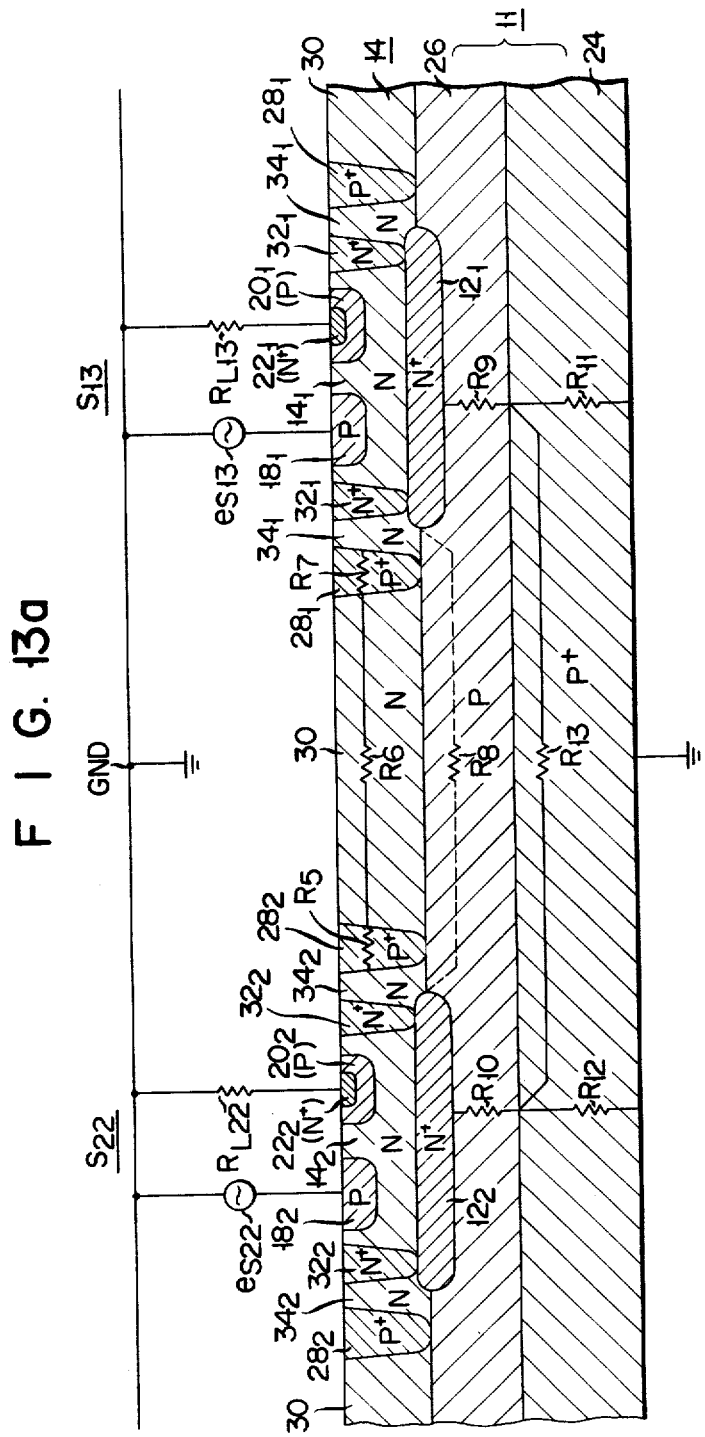

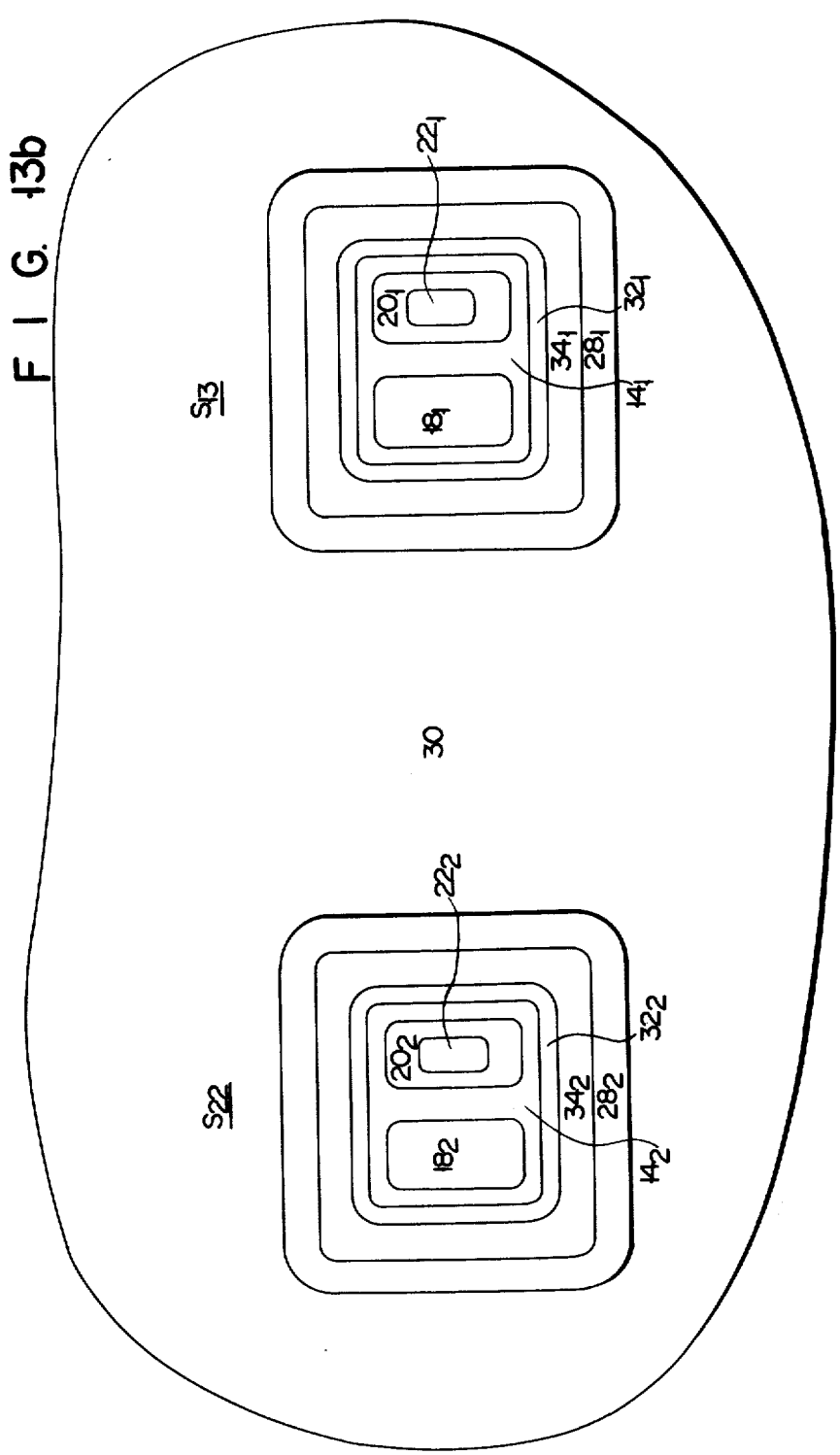

F I G. 15a
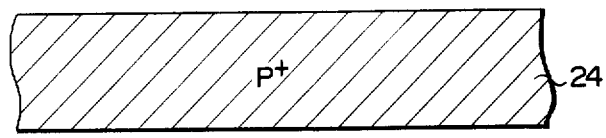
F I G. 15b
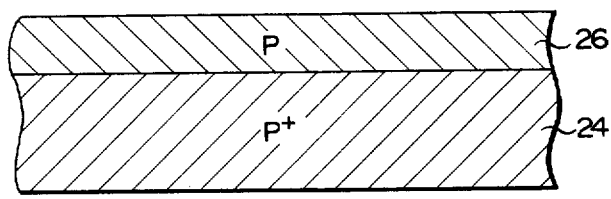
F I G. 15c
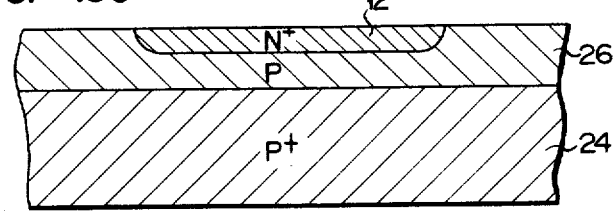
F I G. 15d
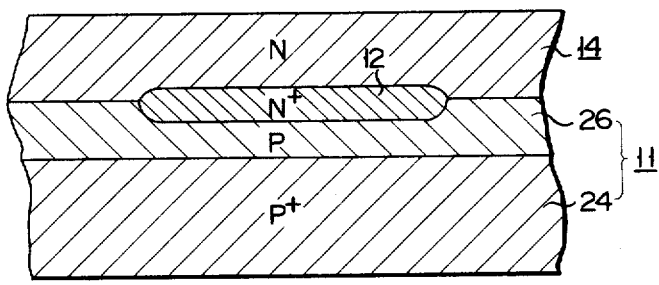

F I G. 15e
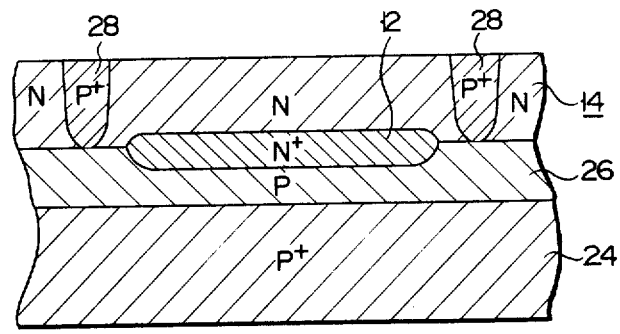
F I G. 15f
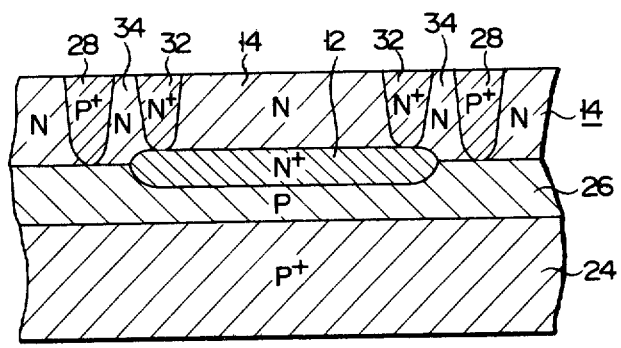
F I G. 15g
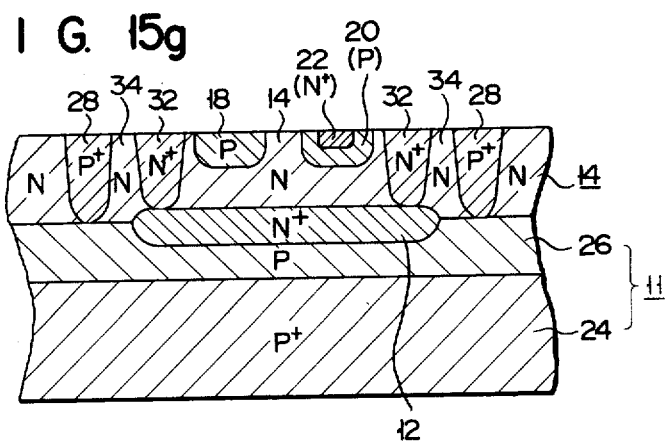

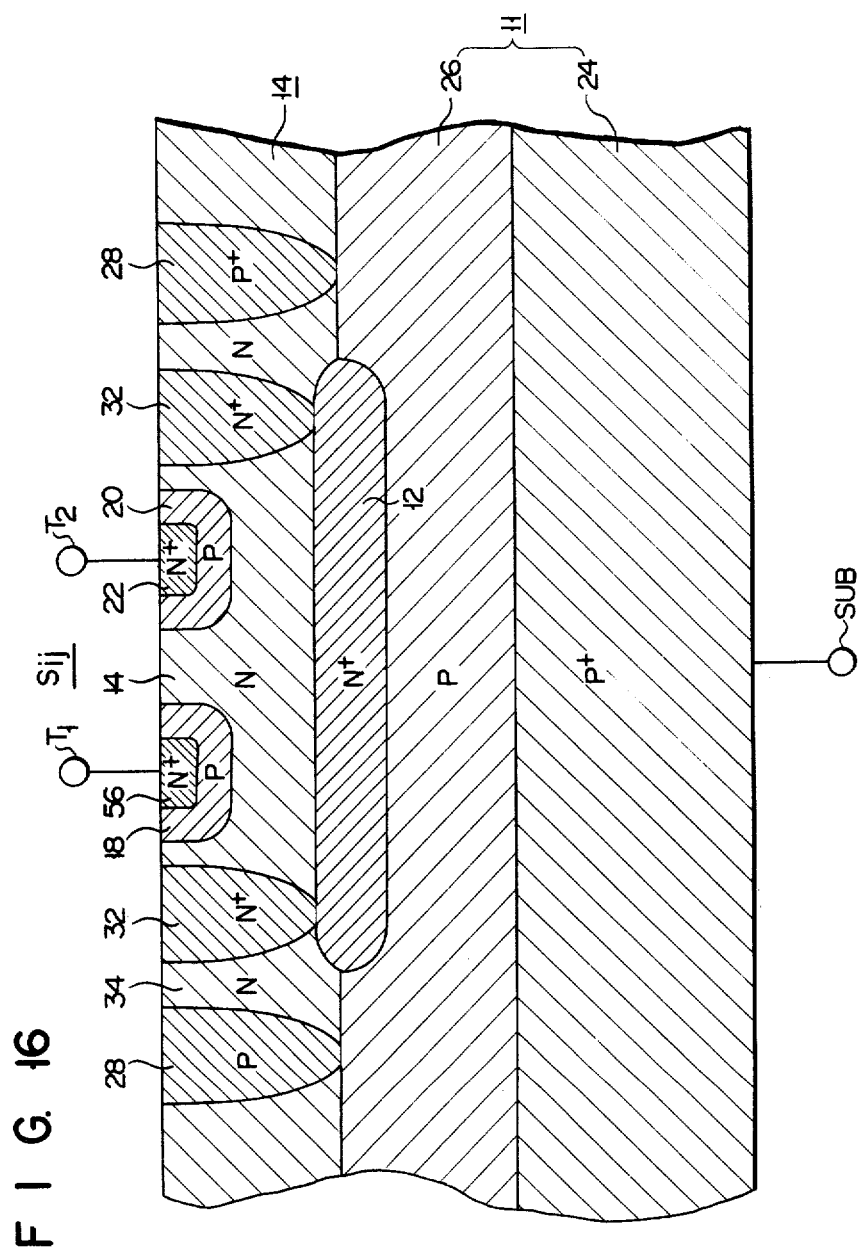

4,246,594

LOW CROSSTALK TYPE SWITCHING MATRIX OF MONOLITHIC SEMICONDUCTOR DEVICE

BACKGROUND OF THE INVENTION

The invention relates to a switching matrix of monolithic semiconductor device in which a number of PNPN type switching elements are formed on a single chip semiconductor by using a PN junction isolation technology.

Through the studying of a video switching system for exchanging a great deal of electrical signal information, it has been found that it is necessary to exchange analogue video signal or high speed digital signals at 100 Mb/s (Mega bits/second). This necessitates switching matrices capable of exchanging signals with wide frequency band in the order of 100 MHz, and such a necessity has triggered a pressing-need development of new signal switches. By convention, signal switches using switching elements of PNPN type are used for a switching matrix for a private branch exchange or a low speed digital signal exchange for computers. A dielectric isolation technology or an air isolation technology have been used for manufacturing the switching matrix, but it has scarcely been found that the PN junction isolation technology is used in the manufacturing of the switching matrix of monolithic semiconductor device. In such an electronic switching matrix, it is difficult to manufacture the one of high withstanding voltage, i.e. high maximum voltage level of the handling signal. Nevertheless, when it is used in the signal switch not requiring such a high withstanding voltage such as the video switching system, unlike the telephone switching system, there is no problem in practical use. Unfortunately, however, a conventional switching matrix of monolithic semiconductor device manufactured by the PN junction isolation technology suffers large signal crosstalk. The signal crosstalk is more remarkable as the frequency of it is higher. For this, the conventional switching matrix is impractical when it handles a signal of several MHz or more frequency. The following technics useful to improve the disadvantages have been known.

In U.S. Pat. No. 3,977,019, for example, there is disclosed a common collector darlington circuit using a P/P+ type double structure substrate to reduce the series resistance of the collector of the transistor formed therein.

In U.S. Pat. No. 3,760,239, the P type region is enclosed by the N+ type compensation region. Therefore, it is impossible to form a lateral type PNPN type switching element of the invention. The N+ compensation region also is used to isolate the elements from one another and to reduce the series resistance of the collector of the transistor.

A structure with the N+ type region enclosing the PNPN type switching element is described by A. R. Hartman and P. W. Shachle in an article "A Junction Technology for Integrating Silicon Controlled Rectifiers in Crosspoint Switching Circuits", IEDM 1976, page 55.

SUMMARY OF THE INVENTION

Accordingly, an object of the present invention is to provide a switching matrix of monolithic semiconductor device in which the signal crosstalk is remarkably reduced through cooperation of a low resistive double layered substrate and high resistive separation regions.

Another object of the present invention is to provide switching matrix of monolithic semiconductor device of which the crosstalk is further lessened by reducing the current amplification factor of a parasitic transistor parasitized in the switching matrix.

To achieve the objects of the invention, there is provided a switching matrix of monolithic semiconductor device having a plurality of lateral type PNPN type switching elements arranged in matrix fashion, comprising: a first conductivity type substrate including a first layer with high impurity concentration and a second layer with low impurity concentration, these first and second layers being layered; a second conductivity type third layer with low impurity concentration formed on the second layer to form the switching elements; a second conductivity type buried layers with high impurity concentration formed at the junction between the second layer and the third layer and at the crosspoints of the switching matrix; switch regions formed in the third layer on the buried layers to construct the switching elements at the respective crosspoints of the switching matrix; first conductivity type isolation regions formed in the third layer, enclosing the switch regions and contacting the second layer; and separation regions of the third layer formed between the isolation regions.

To achieve the latter objects, the switching matrix of the invention further comprises second conductivity type compensation regions with high impurity concentration contacting the buried layers inside the isolation regions in the third layer, in order to reducing the current amplification factor of the parasitic transistor.

In the above two construction, the former may effectively reduce the signal crosstalk and, when the latter is used together, the signal crosstalk is further improved.

Other objects and advantages of the invention will be apparent from the following description taken in connection with the accompanying drawings, in which:

BRIEF DESCRIPTION OF THE DRAWINGS

FIG. 4 shows an equivalent circuit of the diode thyristor structure shown in FIGS. 2 and 3a;

FIG. 5 shows an equivalent circuit of a conventional switching matrix shown in FIG. 2;

FIG. 6 shows an equivalent circuit of a switching matrix according to the invention shown in FIG. 3a;

FIG. 7 shows an equivalent circuit which is a reduction of the circuit in FIG. 5;

FIG. 8 shows an equivalent circuit which is a reduction of the circuit of FIG. 6;

FIGS. 13a and 13b are sectional and top views of another embodiment of the switching matrix of the invention, when lateral type diode thyristors are used as the switching elements;

FIGS. 15a to 15g show a series of partial sectional views for illustrating a series of manufacturing processes of the switching matrix of the invention, when lateral type diode thyristors are used as the switching elements; and FIG. 16 shows a sectional view of the switching matrix of the invention when triac or bidirectional thyristors are used for the lateral type PNPN type switching element used in the invention.

DETAILED DESCRIPTION OF THE PREFERRED EMBODIMENTS

Figure 1:
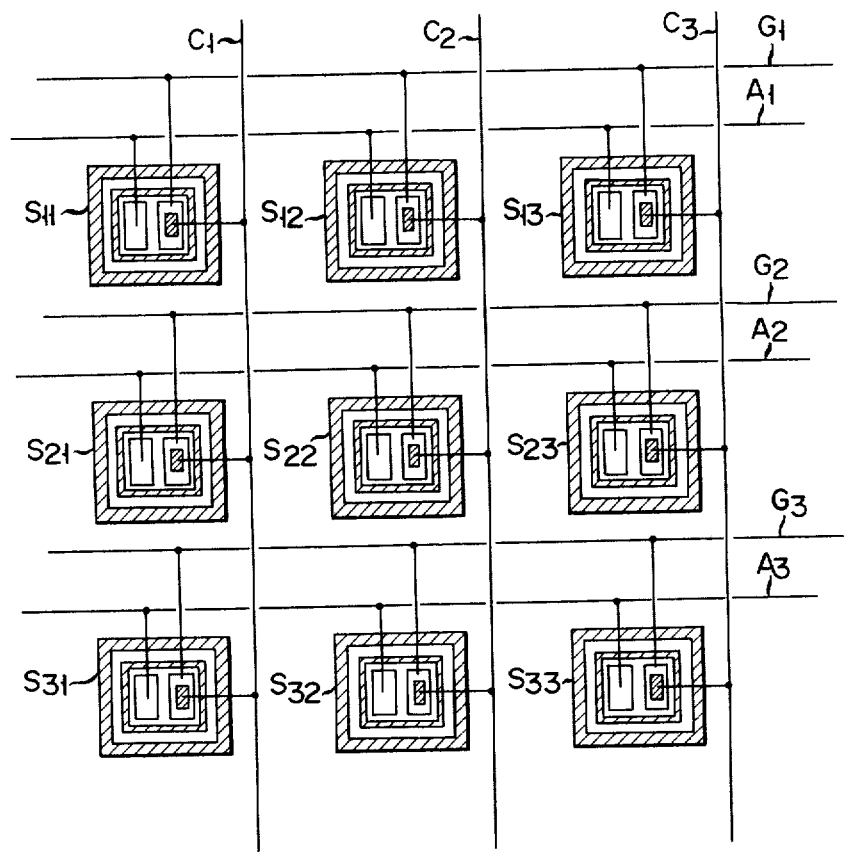
FIG. 1 is a top view of a part of a switching matrix of monolithic semiconductor device.

Referring now to FIG. 1, there is shown a part of a switching matrix prepared by a monolithic integrated circuit (IC). Switching elements $S_{ij}$ (i=1 to 3, j=1 to 3) in FIG. 1 are each expressed in the form of a triode thyristor relating to the present invention. The anodes $A_i$ and the gates $G_i$ of these switching elements $S_{ij}$ are coupled with row lines of the matrix and the cathodes $C_j$ of the switching elements $S_{ij}$ are coupled with the column lines of the matrix. The matrix arrangement of the switching elements $S_{ij}$ may be of a conventional type.

In FIG. 1, special harmful signal crosstalk which passes through substrate takes place particularly between adjacent switching elements not disposed on the same row and column. Accordingly, the signal crosstalk to be discussed is the one occurring between the switching elements $S_{22}$ and $S_{13}$ in FIG. 1. In the drawings, similar reference characters refer to similar portions, for simplicity of explanation. Additionally, directions "upper", "right" and the like refer to the invention as viewed in the drawings.

Figure 2:
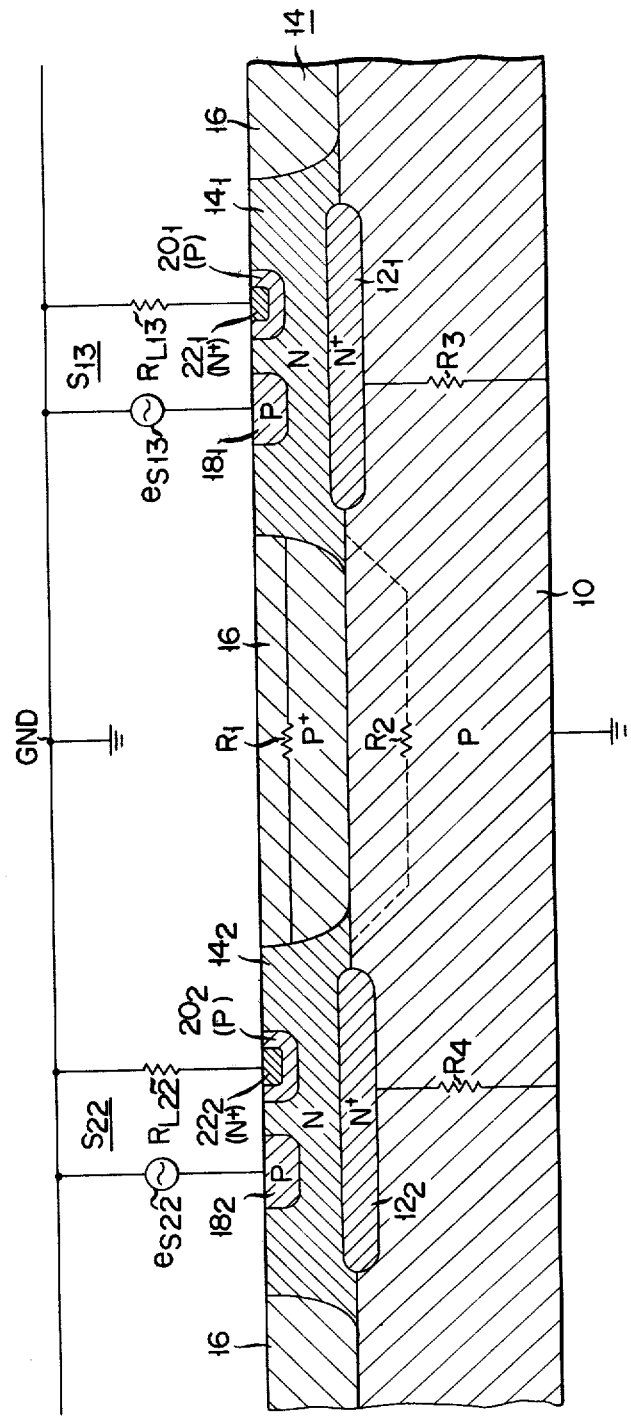
FIG. 2 shows a sectional view of a part of a conventional switching matrix when lateral type diode thyristors are used for the switching elements.

Before proceeding with description of the signal crosstalk, structures of a conventional switching matrix and a switching matrix according to the present invention will first be given. FIG. 2 shows in cross section the structure of a conventional switching matrix by a PN junction isolation technology, and, as shown, the matrix is provided with a substrate 10 of a P type layer with low impurity concentration. Buried diffused layers $12_1$ and $12_2$ each of an N+ type layer with high impurity concentration are diffused at the given locations on the substrate 10 where the switching elements $S_{13}$ and $S_{22}$ are to be disposed. Further, N type layers 14 with low impurity concentration are epitaxial-grown on the surface of the substrate 10 where the layers $12_1$ and $12_2$ are formed. An isolation region 16 of a P+ type layer with high impurity concentration is diffused into the portion of the layer 14 at the bottom of which layers $12_1$ and $12_2$ are not formed. As shown, the isolation region 16 formed reaches the upper surface of the substrate 10. The formation of the isolation region 16 parts the N type layer 14 into two N type regions $14_1$ and $14_2$ at the bottom of which the layers $12_1$ and $12_2$ are formed, respectively. The N type regions $14_1$ and $14_2$ serve as anode gate electrodes of the switching elements $S_{22}$ and $S_{13}$. Into the surface regions of the N type regions $14_1$ and $14_2$ are separately diffused a couple of P type regions $18_1$ and $20_1$ and a couple of $18_2$ and $20_2$, respectively, as shown. Additionally, into the regions $20_1$ and $20_2$ are diffused N+ type regions $22_1$ and $22_2$ with high impurity concentration, from above. The regions $18_1$ and $18_2$ serve as anode electrodes of the switching elements $S_{22}$ and $S_{13}$. The regions $22_1$ and $22_2$ serve as cathode electrodes of the same elements. Signal sources $e_{s13}$ and $e_{s22}$ are connected between the anode electrodes $18_1$ and $18_2$, and a ground line (GND), respectively. Similarly, load resistors $R_{L13}$ and $R_{L22}$ are connected between the cathode electrodes $22_1$ and $22_2$, and the ground line, respectively.

In the above construction, the regions 14, 18, 20 and 22 cooperate to constitute a lateral type PNPN type switch structure, or a reverse blocking diode thyristor structure. Further, if the region 20, for example, is used as a cathode gate electrode, such the structure forms a triode thyristor as used in the matrix in FIG. 1. Furthermore, if the region 20 is used as a cathode gate electrode and the region 14 as an anode gate electrode, the structure forms a tetrode thyristor.

Figure 3A:
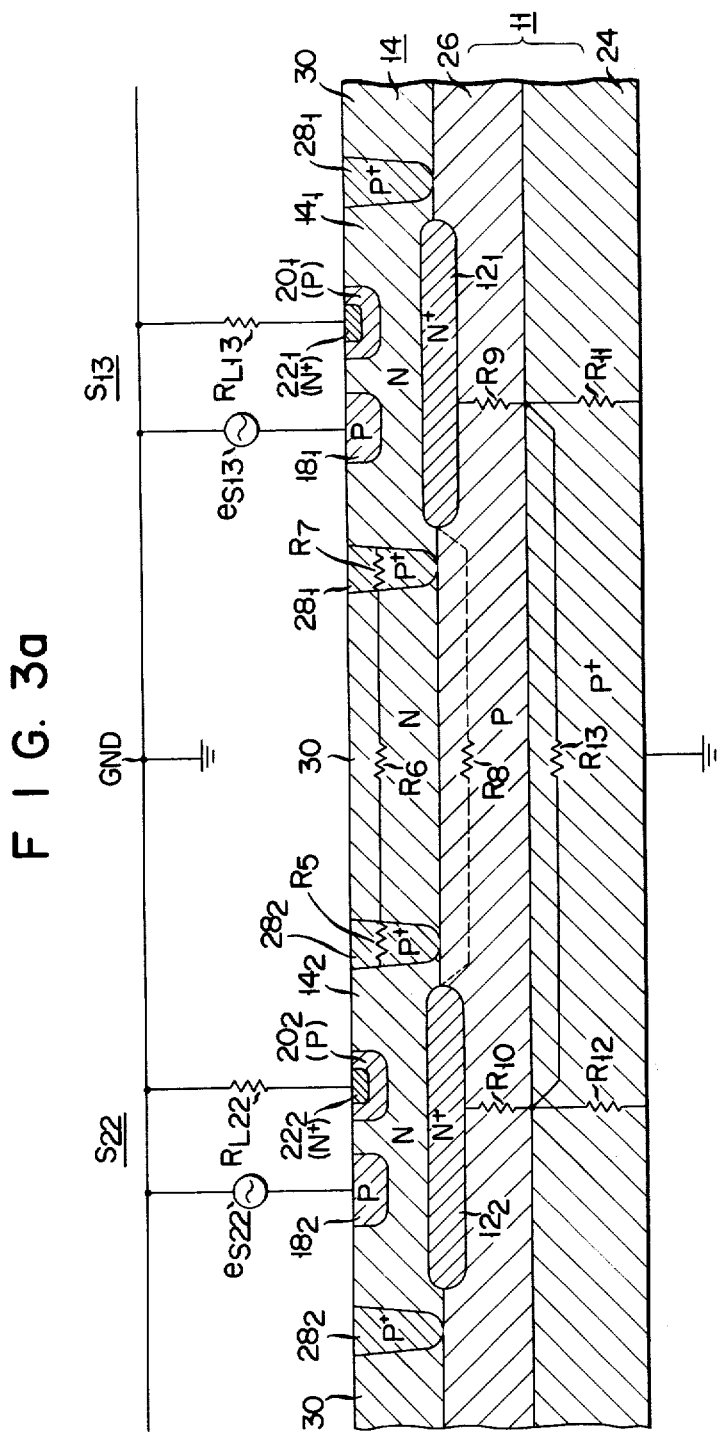
FIGS. 3a and 3b show sectional and top views of an embodiment of a switching matrix according to the present invention when lateral type diode thyristors are used for the switching elements.
Figure 3B:
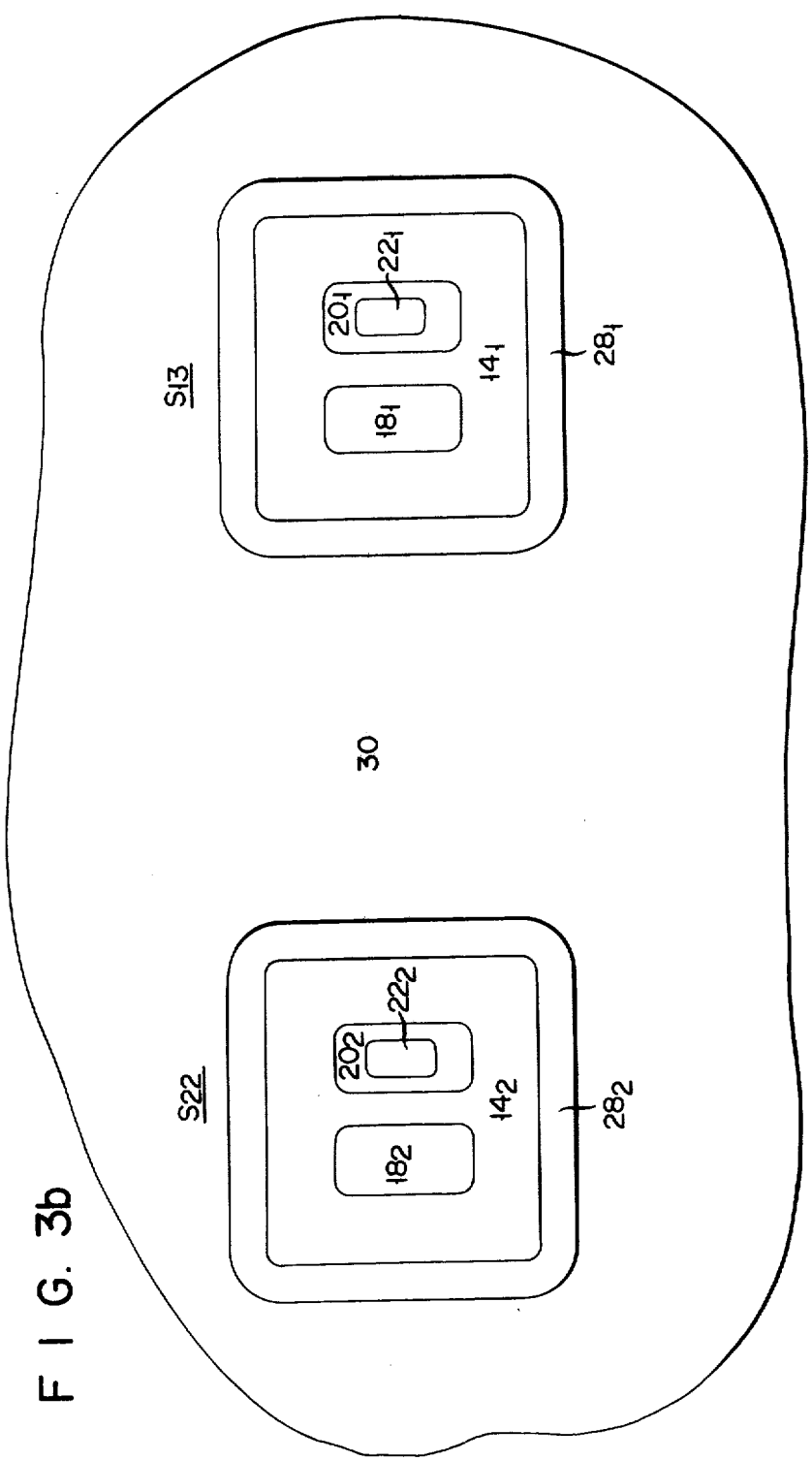

Turning now to FIGS. 3a and 3b, there is shown the structure of the switching matrix according to the invention, by using the PN junction isolation technology. As shown, a substrate 11 is of P/P+ type double structure in which a P type layer 26 with low impurity concentration is layered over a $P^{30}$ type layer 24 with high impurity concentration. From a view point of reduction of the signal crosstalk, it is preferable that the impurity concentration of the layer 24 is as high as possible. Nevertheless, approximately $5 \times 10^{19}$ cm$^{-3}$ is sufficient for the concentration of layer 24 and approximately $1 \times 10^{15}$ cm$^{-3}$ for the layer 26, from a practical view point. For reduction of the crosstalk, the thinner the thickness of the layers 24 and 26 are, the better. In practical use, about 300 μm of the layer 24 and about 5 μm of the layer 26 give rise to no problem from a practical view point, however. The layer 24 used in the substrate 11 is used for reducing the substrate resistance of the substrate 11 and, if possible, the layer 24 may be metal. The layer 26 is thin and has functions to reduce the substrate capacitance ($C_{SUB}$) between the substrate 11 and the buried diffused N+ type layer 12 diffused into the area of the layer 26 surface where the switching elements $S_{ij}$ are disposed, and to increase the withstanding voltage between the layer 12 and the substrate 11.

The N type layer 14 is formed on the layer 26 by the epitaxial growth method, or the like. Isolation regions $28_1$ and $28_2$ each of P+ type region with high impurity concentration are formed in the layer 14, contacting at the bottoms with the layer 26 but not with the layers $12_1$ and $12_2$, respectively. The formation of these regions provides a region of the layer 14, i.e. a separation region 30, between the regions $28_1$ and $28_2$. The wider the width of the region 30, or the interval between the regions $28_1$ and $28_2$, the better, when the reduction of the crosstalk is taken into consideration. However, an integration density measure restricts the widening of the interval. Approximately 10 μm of the width suffices for the practical requirement.

In the conventional structure shown in FIG. 2, the equivalent resistors $R_1$ and $R_2$ of the isolation region 16 and that of the substrate 10 are connected in parallel between the switching elements $S_{13}$ and $S_{22}$, i.e. the anode gate regions $14_1$ and $14_2$. Further, between the layers $12_1$ and $12_2$, and the bottom surface of the substrate 10 are inserted equivalent resistors $R_3$ and $R_4$.

On the other hand, in the structure of the invention in FIG. 3a, between the regions $14_1$ and $14_2$, are inserted a series of equivalent resistors $R_5$, $R_7$ and $R_6$ of the isolation regions $28_2$ and $28_1$ and the separation region 30, and an equivalent resistors $R_8$ of the layer 26, in parallel fashion. Between the layers $12_1$ and $12_2$, and the bottom surface of the substrate 11, are a series of equivalent resistors $R_9$ and $R_{11}$ and another series of resistors $R_{10}$ and $R_{12}$ of the layers 26 and 24, respectively. Additionally, a connection point between the resistors $R_{10}$ and $R_{12}$ has an equivalent resistor $R_{13}$ of the layer 24 against the connection point between the resistors $R_9$ and $R_{11}$.

The bottom surface of the substrate 10 or 11 is used in a floating state or connected to the minimum potential circuit. When these substrates are used in the floating state, leak current giving rise to the signal crosstalk directly flows through the isolation region 16 or the separation region 30 and the substrate 10 or the substrate 11, with the result that the signal crosstalk increases. For this reason, an explanation to be made employs the case where the bottom surface of the substrate 10 or 11 is grounded.

Figure 4:
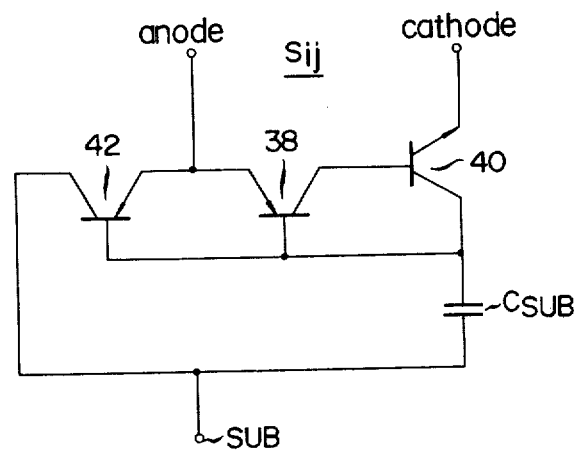

A brief description will be given of the equivalent circuit of the switching elements $S_{ij}$ shown in FIGS. 2 and 3a, with reference to FIG. 4. In the figure, reference numeral 38 designates a PNP type transistor consisting of the P type region 18, the N type region 14 and the P type region 20; numeral 40 an NPN type transistor consisting of the N type region 14, the P type region 20 and the N+ type region 22; numeral 42 a parasitic PNP type transistor consisting of the P type region 18, the N type region 14, the isolation region 16 and the substrate 10, or the P type region 18, the N type region 14, the isolation region 28 and the P type layer 26; symbol $C_{SUB}$ a substrate capacitance, i.e. a PN junction capacitance between the N+ type layer 12 and the N type region 14, and the substrate 10 and the isolation region 16, or a PN junction capacitance between the N+ type layer 12 and the N type region 14, and the P type layer 26 and the isolation region 28. As readily seen from the equivalent circuit, the transistors 38 and 40 form a thyristor, or a PNPN type switching element $S_{ij}$.

When the switching element $S_{ij}$ is in OFF state, the circuit path from the emitter of the transistor 38 to the emitter of the transistor 40, i.e. the path from the anode terminal to the cathode terminal, is open. At this time, no current flows from the anode terminal to the cathode terminal so that the parasitic transistor 42 is not biased but cut off. On the other hand, when the switching element $S_{ij}$ is in ON state, the anode terminal is substantially shortcircuited to the cathode terminal, while at the same time the parasitic transistor 42 is biased to be in active state. In other words, when the element $S_{ij}$ is in ON state, a part of current flowed from the anode terminal goes to the substrate terminal, through the transistor 42, finally to be the leak current causing the signal crosstalk.

As described above, the AC equivalent circuits of the structures shown in FIGS. 2 and 3a are as shown in FIGS. 5 and 6. When the switching elements $S_{22}$ and $S_{13}$ are both in ON state, the process of the signal crosstalk production may be interpreted in the following.

The equivalent circuit shown in FIG. 5 will first be given. A part of a signal current $i_{22}$ fed from the signal source $e_{s22}$ flows as the leak current $\alpha \cdot i_{22}$ to the resistors $R_1$, $R_2$ and $R_4$, through the parasitic transistor $42_2$.

Here, the alpha ($\alpha$) is a current amplification factor of the parasitic transistor $42_2$ when operating in common-base mode, and takes a value equal to or less than 1. The leakage current $\alpha \cdot i_{22}$ produces a leakage voltage $e_{51}$ at the connection point among the resistors $R_1$, $R_2$ and $R_4$. The potential $e_{51}$ is voltage-divided by a resistor voltage dividing circuit including the resistors $R_1$, $R_2$ and $R_3$ to appear as a potential $e_{52}$ at the connection point among the resistors $R_1$, $R_2$ and $R_3$. The potential $e_{52}$ is transmitted to the load resistor $R_{L13}$, via the substrate capacitance $C_{SUB1}$ and the collector-emitter circuit of the transistor 40. Since the switching element $S_{13}$ is in ON state, the collector-emitter circuit of the transistor $40_1$ is continuous. Accordingly, if the internal impedance of the signal source $e_{s13}$ is much larger than that of the resistive load $R_{L13}$, the potential $e_{52}$ is divided by a high pass filter including the capacitance $C_{SUB1}$ and the resistor $R_{L13}$ to be a leakage potential $e_{13}$ appearing across the resistor $R_{L13}$. The potential $e_{13}$ corresponds to the signal crosstalk arising from the potential $e_{s22}$.

Turning now to FIG. 6, there is shown an equivalent circuit of the switching element $S_{ij}$ of the present invention. As shown, a leakage voltage $e_{61}$ appears at the connection point among the resistors $R_5$, $R_8$ and $R_{10}$, as in the case of FIG. 5. The potential $e_{61}$ is changed by a voltage divider circuit including resistors $R_5$ to $R_{13}$ to a potential $e_{62}$ of leakage voltage appearing at the connection point among the resistors $R_7$, $R_8$ and $R_9$. The potential $e_{62}$ is divided by a high pass filter including the capacitance $C_{SUB1}$ and the resistor $R_{L13}$ to be a potential $e_{13}$ of leakage voltage appearing across the resistor $R_{L13}$. The potential $e_{13}$ corresponds to the signal crosstalk arising from the potential $e_{s22}$.

In FIGS. 5 and 6, $R_2 >> R_1$, $R_8 >> (R_5 + R_6 + R_7)$, $R_6 >> (R_5 + R_7)$ and the resistor $R_{13}$ is extremely small. If the resistors $R_2$, $R_5$, $R_7$, $R_8$ and $R_{13}$ are omitted, the equivalent circuit in FIG. 5 may reduce to that shown in FIG. 7. Similarly, the circuit in FIG. 6 reduces to that shown in FIG. 8. As seen from the circuit in FIG. 7, the equivalent circuit of the conventional switching elements shown in FIG. 2 includes the $\pi$ resistive circuit. On the other hand, the equivalent circuit of the switching element structure of the invention shown in FIG. 3a includes a bridged T resistive circuit, as shown in FIG. 8. In the conventional case shown in FIG. 2, the resistivity of the substrate 10 is set up high in order to increase the withstanding voltage at the PN junction for isolation and to reduce the substrate capacitance. Accordingly, the voltage drops produced across the resistors $R_3$ and $R_4$ are large and this makes the signal crosstalk large. In the actual switching matrix, the resistors exist all in the form of distributed constants and not in the clear form as shown in FIGS. 7 and 8. It should be expressly understood, however, that the explanation has been made and will be continued by using lumped constants, for purposes of simplicity and easy of qualitative discussion.

As will be seen from the above discussion, the signal crosstalk arises from the leak current, or the collector current of the parasitic transistor 42. The leak current is little dependent on the signal frequency or is more damped as the signal frequency is higher. On the contrary, the crosstalk signal resulting from the leak current passes a high pass filter including the capacitor $C_{SUB1}$ and the resistor $R_{L13}$ so that the larger the crosstalk signal, the higher the signal frequency.

Let us qualitatively analize the crosstalk signal difference between the structures of FIG. 2 and FIG. 3a. The degree of the crosstalk from the signal source $e_{s22}$ to the load resistor $R_{L13}$, i.e. the crosstalk loss, is defined $$L_{XT} = 20 \log_{10} |e_{s22}/e_{13}| (dB) \tag{1}$$

This leads to the crosstalk loss $L_{XT7}$ equation of the FIG. 7 case $$L_{XT7} = \tag{2}$$
$$20 \log_{10} \left| \frac{1-\alpha}{\alpha} \left\{ \frac{R_1 + R_3 + R_4}{R_3 R_4} (R_{L22} + \frac{R_{L22}}{R_{L13}} X_C) + \frac{R_{L22}}{R_{L13}} (1 + \frac{R_1}{R_4}) \right\} \right|$$

Similarly, the crosstalk loss $L_{XT8}$ equation of the FIG. 8 case is given $$L_{XT8} = \tag{3}$$
$$20 \log_{10} \left| \frac{1-\alpha}{\alpha(\Delta + R_6 R)} [(R_6 + R_9 + R_{10})(R_{L22} + \frac{R_{L22}}{R_{L13}} X_C) + \frac{R_{L22}}{R_{L13}} \{\Delta + R_6(R_9 + R)\}] \right|$$

where $\Delta = R_9 R_{10} + (R_9 + R_{10})R$.

In the equations (2) and (3), alpha ($\alpha$) is the amplification factor of the parasitic transistor $42_2$ and $X_C$ an impedance of the substrate capacitance $C_{SUB1}$. The impedance $X_C$ is given $$X_C = -j \frac{1}{2\pi f C_{SUB1}} \tag{4}$$

where f is the frequency (Hz).

Let us find the crosstalk losses $L_{XT}$ on examples to be shown in FIGS. 9 to 12. Before working out the crosstalk losses, assumptions tabulated in Tables 1 to 3 are made on the respective examples.

TABLE 1

|  | Concentration n (cm$^{-3}$) | Resistivity $\rho$ ($\Omega \cdot$ cm) |
| --- | --- | --- |
| P$^+$ regions 44, 46 | $n_s = 1.0 \times 10^{19}$ | $R_S = 12$ $\Omega/\square$ |
| P layers 48, 50 | $n = 1.5 \times 10^{15}$ | $\rho = 1.0 \times 10^1$ |
| N region 52 | $n = 1.0 \times 10^{15}$ | $\rho = 5.0 \times 10^0$ |
| P$^+$ layer 54 | $n = 5.0 \times 10^{19}$ | $\rho = 2.0 \times 10^{-3}$ |

Note
$n_s$: Surface concentration, $R_s$: Sheet resistance.

TABLE 2

| Dimension ($\mu$m) | | |
| --- | --- | --- |
| $l_1, l_3$ : 20 | $d_1$ : 300 | w : 10 |
| $l_2, d_4$ : 10 | $d_3$ : 295 | |
| $d_2$ : 5 | $S_a$ : 200 × 200 | |

Note
w is the dimension of the depth of each example in FIGS. 9 to 12. $S_a$ is the bottom area of the switching element $S_{ij}$ at which the switching element contacts the substrate.

TABLE 3

| f : 4 MHz | $C_{SUB}$ : 20 pF | $\alpha$ : 0.1 | $R_{L22} = R_{L13} = 75 \Omega$ |
| --- | --- | --- | --- |

Now suppose that most of the leak current flows into right under the switching element $S_{ij}$, that is, the signal crosstalk is in the worst condition. Under this supposition, a substrate resistance $R_{VER}$ is given $$R_{VER} = \rho_a d/S_a (\Omega) \tag{5}$$

where $\rho_a$ and d are the resistivity and thickness of the substrate, and $S_a$ is the bottom area of the switching element $S_{ij}$.

Further assume that the leak current flows rectilinearly from the switching element $S_{22}$ to $S_{13}$. Under this assumption, the resistance $R_{LAT}$ of the separation region (or isolation region) disposed between the switching elements $S_{22}$ and $S_{13}$, is expressed $$R_{LAT} = \rho_b l/S_b (\Omega) \tag{6}$$

where $\rho_b$ and l is the resistivity and the length of the separation region (or isolation region), $S_b$ is the contact area between the isolation region and the switching element $S_{ij}$ and $S_b = w \times d_4$.

Let us calculate the crosstalk losses $L_{XT}$ on the cases in FIGS. 9 to 12, on the basis of the equations (2) to (6) and the materials in tables 1 to 3.

Figure 9:
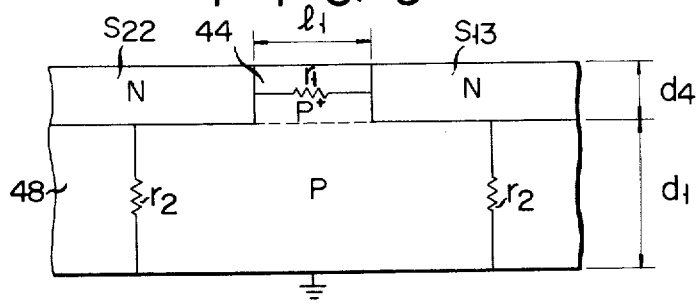
FIG. 9 shows a model of the conventional switching matrix to calculate the signal crosstalk amount.

1. FIG. 9 Case

From the equation (5), $R_{VER} = r_2 = 750\Omega$. This corresponds to the resistors $R_3$ and $R_4$ in the equation (2).

From the equation (6), we obtain $R_{LAT} = r_1 = 24\Omega$. This corresponds to the resistor $R_1$ in the equation (2).

From the equation (4), we obtain $X_C = -j2K\Omega$. By putting $\alpha = 0.1$ and $R_{L22} = R_{L13} = 75\Omega$ into the equation (2), we have the crosstalk loss $L_{XT}$ of the FIG. 9 case $$L_{XT1} \simeq 33.9 \text{ dB}.$$

Figure 10:
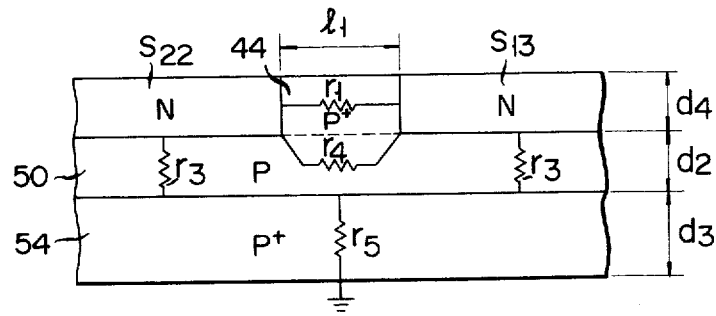
FIGS. 10 and 11 show models of the switching matrices with different structures for signal crosstalk reduction, in order to calculate the signal crosstalk amount under the same condition as that of the FIG. 9 model.

2. FIG. 10 Case

When the equation (5) is applied to two substrates, $r_3 = 12.5\Omega$ and $r_5 = 0.074\Omega$. The resistance $r_3$ corresponds to the resistors $R_9$ and $R_{10}$ in the equation (3). The resistance $r_5$ corresponds to the resistor R in the equation (3).

From the equation (6), we have $R_{LAT} = r_1 = 24\Omega$. The resistance $R_{LAT} = r_4$ by the P type layer is $30K\Omega$. The $r_1$ corresponds to the resistor $R_6$ in the equation (3), and the resistance $r_4$ is neglected in the equation (3), because $r_1 = 24\Omega << r_4 = 30K\Omega$. As in the above case, by putting thus obtained values, $X_C = -j2K\Omega$, $\alpha = 0.1$ and $R_{L22} = R_{L13} = 75\Omega$ into the equation (3), we have the crosstalk loss $L_{XT2}$ of the FIG. 10 case $$L_{XT2} \simeq 74.1 \text{ dB}.$$

Figure 11:
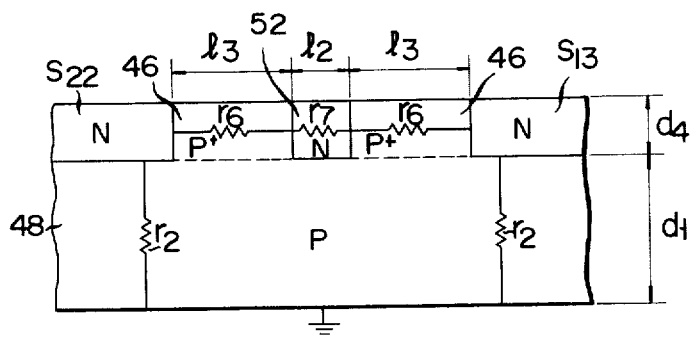

3. FIG. 11 Case

From the equation (5), we obtain $R_{VER} = r_2 = 750\Omega$. This corresponds to the resistances $R_3$ and $R_4$ in the equation (2). When the equation (6) is applied to the isolation regions 46 and the separation region 52, $R_6 = 24\Omega$ and $r_7 = 5K\Omega$. In the equation (2), $R_1$ corresponds to $2r_6 + r_7 \simeq r_7$.

As in item 1, by substituting thus obtained values and $X_C = -j2K\Omega$, $\alpha = 0.1$ and $R_{L22} = R_{L13} = 75\Omega$, the crosstalk loss $L_{XT3}$ of the FIG. 11 case is $$L_{XT3} \simeq 47.0 \text{ dB}.$$

Figure 12:
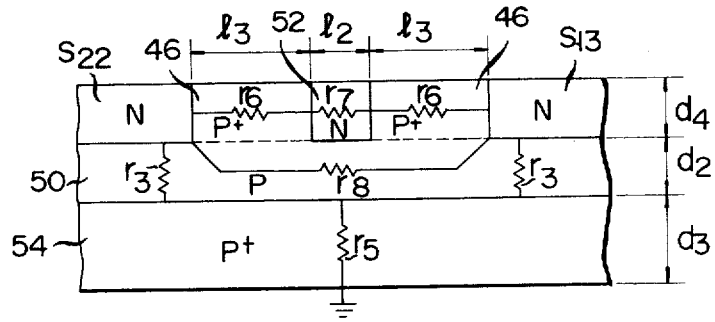
FIG. 12 is a model of the switching matrix of the invention to calculate the signal crosstalk amount under the same condition as of the FIGS. 9 to 11.

4. FIG. 12 Case

As in the previous items, when the resistances $R_{VER}$ and $R_{LAT}$ are calculated, we obtain $r_6 = 24\Omega$, $r_7 = 5K\Omega$, $r_3 = 12.5\Omega$, $r_5 = 0.047\Omega$ and $r_8 = 50K\Omega$. In the equation (3), the resistance $R_6$ corresponds to $2r_6 + r_7 \simeq r_7$, the resistances $R_9$ and $R_{10}$ to the resistance $r_3$, and the resistance R to the resistance $r_5$. In the equation (3), since $r_7 = 5K\Omega << r_8 = 50K\Omega$, the $r_8$ is neglected. By substituting thus obtained values and $X_C = -j2K\Omega$, $\alpha=0.1$ and $R_{L22}=R_{L13}=75\Omega$ into the equation (3), the crosstalk loss $L_{XT4}$ in FIG. 12 is $$L_{XT4} = 104.7 \text{ dB}.$$

As seen from the above calculations, the crosstalk improvement of the FIGS. 10 and 11 cases over the FIG. 9 case of the conventional type is $$L_{XT2}-L_{XT1}=40.2 \text{ dB and } L_{XT3}-L_{XT1}=13.1 \text{ dB}.$$

When the FIGS. 10 and 11 cases are combined in use, the resultant improvement of the crosstalk is 53.3 dB.

On the contrary, the crosstalk improvement of the FIG. 12 case is $$L_{XT4}-L_{XT1}=70.8 \text{ dB}.$$

This is 17.5 dB larger than the improvement of the FIGS. 10 and 11 combination. Notable that the FIG. 12 case is remarkably advantageous over the combination of the FIGS. 10 and 11, and that this distinguish effect of the FIG. 12 case results from the useful combination and not from mere aggregation.

The explanation to follow is a further improvement of the crosstalk. From the equation (3), it will be understood that lessening of the current amplification factor alpha ($\alpha$) of the parasitic transistor 42 may improve the crosstalk loss. The lessening of the alpha ($\alpha$) is realized by the structure shown in FIGS. 13a and 13b. As shown, compensation N+ type regions $32_1$ and $32_2$ with high impurity concentration are diffused into the N type regions $14_1$ and $14_2$, respectively. The compensation region 32 is formed inside the isolation region 28, enclosing the switching element including the regions 14, 18, 20 and 22. The diffusion of the compensation region 32 is deeply made to reach the buried diffused layer 12. At this time, the N type region 34 with low impurity concentration is left remaining between the regions 28 and 32. The region 34 is used for improving the withstanding voltage between the switching element $S_{ij}$ and the region 28. Therefore, if the situation permits a low withstanding voltage, the crosstalk loss may be sufficiently improved without the region 34.

Use of the compensation region 32 provides the following effects.

Let us consider the effects on the switching element $S_{22}$ shown in FIG. 13a. Carriers, i.e. positive holes, injected from the emitter $18_2$ of the parasitic transistor $42_2$ in the switching element $S_{22}$, pass the base $14_2$ of the transistor $42_2$ to flow into the collector 26 of the transistor $42_2$. At this time, the positive holes must pass the N+ type layer $12_2$ and/or the N+ type region $32_2$. Through the passing, the positive holes combine with the negative electrons in the layer $12_2$ and/or the region $32_2$ to almost disappear so that few carriers injected into the emitter $18_2$ are transferred to the collector 26. Such a carrier reduction effect is attainable by using only the layer $12_2$. However, it is difficult to remarkably reduce the carrier in this manner of a sole layer $12_2$ use, since there occur carriers flowing deviated from the layer $12_2$. On the contrary, in the present invention, the parasitic transistor $42_2$ is completely enclosed by the N+ type region $32_2$ and the N+ type layer $12_2$ so that the carriers in question may be very effectively reduced. In other words, the combination of the N+ type layer 12 with the N+ type region 32 considerably reduces the current amplification factor alpha ($\alpha$) of the parasitic transistor 42.

The effects of the compensation region 32 will be qualitatively given. The current amplification factor alpha ($\alpha$) will be worked out under the following conditions.

TABLE 4

| buried diffused N+ type layer 12; | $C_S = 5.0 \times 10^{19}$ cm$^{-3}$ | $X_j = 9\mu$m |
|---|---|---|
| epitaxial N type layer 14; | $n = 1.2 \times 10^{16}$ cm$^{-3}$ | $d = 10\mu$m |
| isolation P+ type region 28; | $C_S = 1.0 \times 10^{19}$ cm$^{-3}$ | $X_j = 12\mu$m |
| emitter P type region 18; | $C_S = 5.0 \times 10^{18}$ cm$^{-3}$ | $X_j = 2\mu$m |
| minimum space between the regions 28 and 32; | ~ $7\mu$m | |
| $V_{BE}$: | $-0.7$ volt | |
| $V_{BC}$: | 0.2 volt | |

Note
$C_S$ is the surface concentration, n the concentration of the entire N type layer 14, $X_j$ the depth of the junction, d the thickness of the layer 14, $V_{BE}$ and $V_{BC}$ are the base-emitter voltage and the base-collector voltage of the parasitic transistor 42.

The result of the simulation by using a Gummel method program performed under the condition of Table 4 is tabulated in Table 5.

TABLE 5

| Concentration (cm$^{-3}$) of Compensation N+ type Region 32 | Current Amplification Factor of Parasitic Transistor 42 |
|---|---|
| $1 \times 10^{16}$ | 0.942 |
| $1 \times 10^{17}$ | 0.812 |
| $1 \times 10^{18}$ | 0.211 |
| $1 \times 10^{19}$ | 0.0181 |
| $5 \times 10^{19}$ | 0.0035 |

The Gummel method has been described by Gummel H. K., "A Self-Consistent Iterative Scheme for One-dimensional Steady State Transistor Calculation" IEEE Trans. on Ed, 11, No. 10 (October 1964) pp. 455–465.

Table 5 shows that the current amplification factor ($\alpha$) of the parasitic transistor 42 may be remarkably reduced by increasing the concentration of the compensation region 32. That is, provision of the compensation region 32 may reduce the current amplification factor to be approximately 1/52 even when the concentration is in the order of $1\times 10^{19}$ cm$^{-3}$ in comparison with $1\times 10^{16}$ cm$^{-3}$ of the concentration. As seen from the equation (3), addition of the region 32 improves the crosstalk by about 58.9 dB.

With such the construction of the invention, the effects attained by the invention are as follows:

(1) The substrate 11 is doubly layered having the P+ type layer 24 with high impurity concentration and the P type layer 26 with low impurity concentration. For this, the resistance of the substrate 11 is reduced; the withstanding voltage of the switching element $S_{ij}$ is ensured; and the substrate capacitance $C_{SUB}$ is reduced. Accordingly, the signal crosstalk may be considerably reduced with the withstanding voltage and the substrate capacitance not inferior to those of the convention structure.

(2) The isolation regions 28 are independently disposed with switching elements $S_{ij}$. A high resistive separation region 30 is disposed between adjacent isolation regions 28 of switching elements $S_{ij}$. This results in reduction of the signal crosstalk.

(3) When items (1) and (2) are combined, an excellent reduction effect of crosstalk is attained which is much superior to the sum of the effects when these are separately used.

(4) Additional provision of the compensation regions 32 to the respective switching elements $S_{ij}$ considerably reduces the current amplification factor ($\alpha$). This further reduces the signal crosstalk, thus providing a switching matrix with little signal crosstalk.

Figure 14:
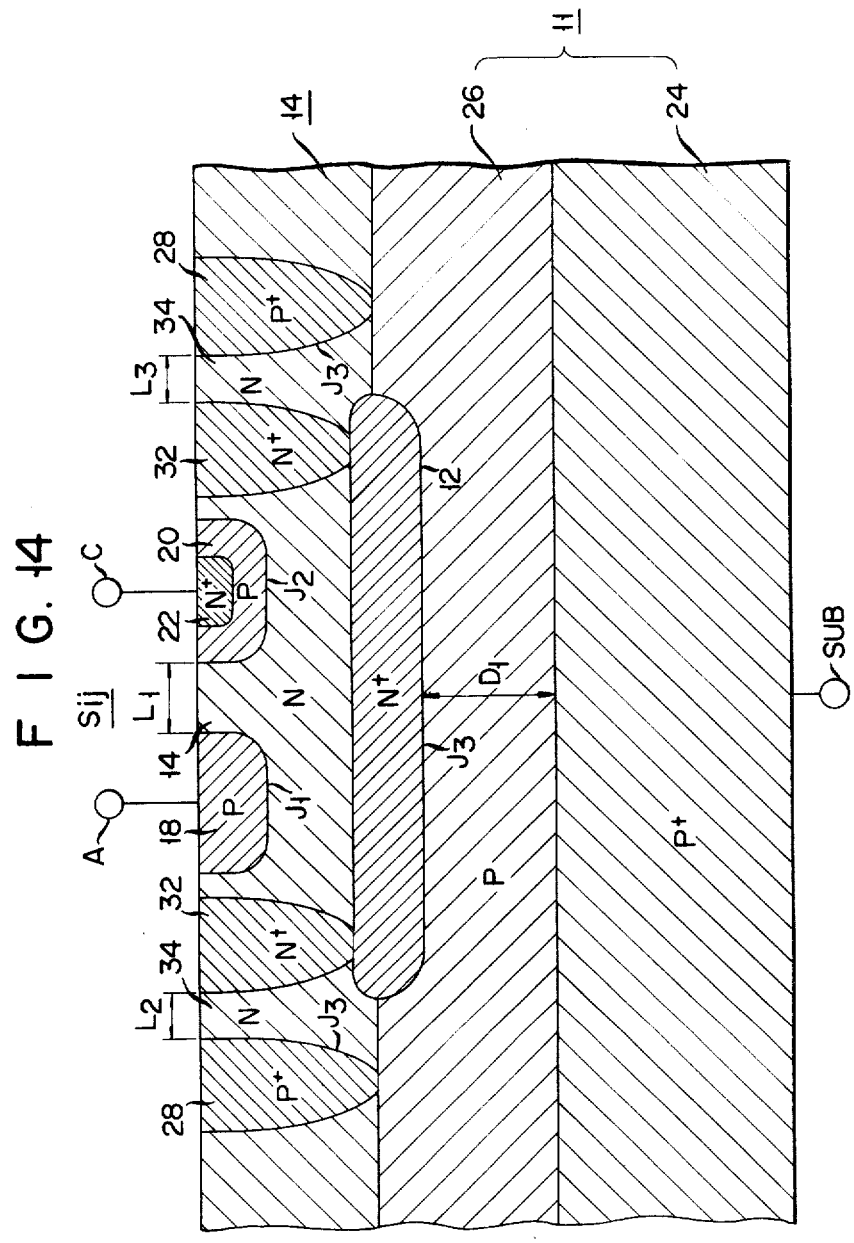
FIG. 14 shows a partial sectional view useful in explaining the withstanding voltage of a lateral PNPN type switching element used for the switching matrix according to the invention.

The withstanding voltage of the switching matrix according to the present invention will be briefed. The withstanding voltage of the PNPN type switching element $S_{ij}$ as shown in FIG. 14 may be categorized into the following two:

(I) The withstanding voltages the PN junction $J_1$ between the P type region 18 and the N type region 14 and at the PN junction $J_2$ between the P type region 20 and the N type region 14;

(II) The withstanding voltages at the junctions $J_3$ between the N type region 34 and the P+ type isolation region 28 and between the N+ type region 12 and the P type layer 26.

First, the withstanding voltages at the PN junctions $J_1$ and $J_2$ are each 200 to 300 V under the condition that a punch through phenomenon does not occur, the concentration of the N type region 14 is $1 \times 10^{15}$ cm$^{-3}$ and special effects on the surface are not taken into consideration. When the punch through phenomenon occurs, the withstanding voltage changes depending on the minimum space $L_1$ between the two junctions $J_1$ and $J_2$. For example, when the concentration of the N type region 14 is $1 \times 10^{15}$ cm$^{-3}$ and the space $L_1$ is 10 $\mu$m, the punch through withstanding voltage is approximately 80 V. In this case, when the concentration of the N type region 14 is increased to be $3 \times 10^{15}$ cm$^{-3}$, the punch through withstanding voltage is about 240 V. As described above, the withstanding voltage in the lateral direction of the switching element $S_{ij}$ may readily be designed by a conventional method, i.e. by properly selecting the concentration of the N type region 14 and the space $L_1$.

Second, when the PN junction $J_3$ becomes breakdown, the withstanding voltage is determined by either of the N type region 34 or the P type layer 26 which is high in the concentration. When the depletion layers at the N type region 34 or at the P type layer 26 contacts the N+ type region 32 or the P+ type layer 24, the withstanding voltage differs. Let us consider the case where breakdown occurs at the P type layer 26. Assume the distance between the N+ type layer 12 and the P+ type layer 24 is $D_1$ and the electric field when the breakdown occurs is $E_B$. The withstanding voltage $V_B$ at this portion is given by $V_B = E_B D_1$. As an example, when the concentration of the P type layer 26 is $1 \times 10^{15}$ cm$^{-3}$, the breakdown electric field $E_B$ is approximately 300 V/20 $\mu$m. Accordingly, when $D_1 = 10$ $\mu$m, the withstanding voltage $V_B$ is about 150 V.

The withstanding voltages mentioned above are theoretical design values. In the present IC manufacturing technology, the withstanding voltage is determined by that at the junction portion exposed to the surface of the semiconductor chip. In the manufacturing by the PN junction isolation technology, the withstanding voltage of the switching element $S_{ij}$ is at most 100 V. Accordingly, the IC manufacturing technology by using the PN junction isolation method is unmatured to apply the switching matrix of monolithic semiconductor device for the signal switches of a telephone exchange requiring a high withstanding voltage. On the other hand, in the switching matrix of the invention, the signal crosstalk is very small and the withstanding voltage in the order of 70 to 80 V may be realized by using the P type layer 26, with small substrate capacitance. Therefore, the switching matrix according to the present invention is suitable for the signal switch by a video exchanging system requiring not a high withstanding voltage but exchanging a wide-band signal at a low crosstalk. Further, since the conventional manufacturing technology may be used, the switching matrix of the invention may be economically produced. In case where a relatively high withstanding voltage is required but a requirement for the signal crosstalk is not severe, those of high withstanding voltage are possible in manufacturing. Therefore, a mechanical type exchange for private branch exchange (PBX) may be replaced by the inexpensive switching matrix of monolithic semiconductor device of the invention.

Finally, a manufacturing process of the switching matrix of the invention will be given in brief. To start, the P+ type layer 24 is prepared for a base chip. See FIG. 15a. The P type layer 26 is epitaxially grown on the P+ type layer 24 to form a substrate, see FIG. 15b. The N+ type layer 12 is diffused into the location of the P type layer 26 where the switching matrix $S_{ij}$ is to be formed, see FIG. 15c. Then, the N type layer 14 is epitaxial-grown on the P type layer 26. See FIG. 15d. At this time, the N+ type layer 12 slightly diffuses into the N type layer 14. Following this, the P+ type region 28 is diffused into the N type layer 14 not contacting the N+ type layer 12 but enclosing it. The P+ type region 28 is deeply formed to an extent that it contacts the P type layer 26, see FIG. 15e. The N+ type region 32 is then formed coaxially with the P+ type region 28, inside the P+ type region 28. The formation of the N+ type region 32 is continued to such an extent that it comes in contact with the N+ type layer 12. At this time, the N type region 14 is formed inside the N+ type region 32 and the N type region 34 is formed between the N+ type region 32 and the P+ type region 28, see FIG. 15f. At a final stage, the P type regions 18 and 20 and the N+ type region 22 are diffused into the N type region 14. See FIG. 15g. A number of thus manufactured switching elements $S_{ij}$ are properly arranged to form a switching matrix.

It will be understood that the PNPN type switching element $S_{ij}$ for the invention is not limited to the thyristor structure as shown in FIGS. 3a, 13a and 14. A substitutional example of such is a lateral type triac structure, or a lateral type bidirectional thyristor structure in which an N+ type region 56 with high impurity concentration is diffused into the P type region 18. The triac structure shown in FIG. 16 is symmetrical. Accordingly, a terminal $T_1$ connected to the N+ type region 56 and a terminal $T_2$ connected to the N+ type region 22 are equivalent, as viewed from an external AC and DC circuit.

The switching elements shown in FIGS. 3a, 13a, 14 and 16 are all of diode type; however, these may be of triode or tetrode type. For example, when a cathode gate terminal is connected to the P type region 20 in FIG. 14, it operates as a triode, and when an anode gate terminal is additionally connected to the N type region 14, it operates as a tetrode. In the case of FIG. 16, connection of a first gate terminal to the P type region 18 forms a triode and additional connection of the second gate terminal to the P type region 20 forms a tetrode. Further, connection of a third gate terminal to the N type region 14 forms a pentode.

Additionally, a switching structure by transistor or diode may be used for the switching element of the invention. Furthermore, the present invention is applicable not only for the switching matrix but for a semiconductor device using a plurality of such elements as to permit the leak current to flow into the substrate for the purpose of crosstalk reduction.

Although a specific construction has been illustrated and described herein, it is not intended that the invention be limited to the elements and the structures arrangements disclosed. One skilled person in the art will recognize the partial elements or substructures may be changed without departing from the spirit of the invention.

What is claimed is:

1. In a low crosstalk type switching matrix of monolithic semiconductor device having a plurality of lateral type PNPN type switching elements ($S_{ij}$) arranged in matrix fashion comprising:
    a first conductivity type double layered substrate (11) including in its entirety a first layer (24) having high impurity concentration and a second layer (26) having low impurity concentration, said first and second layers being layered one upon another;
    a second conductivity type third layer (14) having low impurity concentration formed on said second layer in order to form said switching elements;
    second conductivity type buried layers (12) having high impurity concentration formed at the junction between said second and third layers and at respective crosspoints of the matrix;
    switch regions (14, 18, 20, 22) formed in said third layer over said buried layers at the respective crosspoints of the matrix, in order to form the switching elements; and
    first conductivity type isolation regions (28) formed in said third layer (14), enclosing each of said switch regions and contacting said second layer (26), said isolation regions (28) having outer peripheries;
    the improvement wherein:
    said substrate (11) has a low resistivity; and
    said third layer (14) includes second conductivity type separation regions (30) having low impurity concentration which form a separation distance ($l_2$) between the outer peripheries of said isolation regions (28) for reducing the signal crosstalk in cooperation with said low resistivity of said substrate (11), said separation distance ($l_2$) being about 10 microns.

2. A switching matrix according to claim 1 wherein said switch regions include a first electrode region (18), said third layer (14) includes a second electrode region, and a parasitic transistor (42) is formed by said first electrode region (18), said second electrode region, said second layer (26) and said isolation region (28) of each of said switch regions (14, 18, 20, 22); and further comprising second conductivity type compensation regions (32) having high impurity concentration located in said third layer (14) and contacting said buried layers (12), said compensation regions (32) enclosing said switch regions (14, 18, 20, 22) and being enclosed by said isolation regions (28), in order to reduce the current amplification factor of said parasitic transistor.

3. A switching matrix according to claim 2, wherein said third layer (14) includes second conductivity type regions (34) of low impurity concentration formed between said compensation regions (32) and said isolation regions (28), in order to improve the withstand voltage between said second electrode regions (14) and said isolation regions (28).

4. A switching matrix according to claim 1, wherein said switch regions are triode thyristors.

5. A switching matrix according to claim 1, wherein said switch regions are tetrode thyristors.

6. A switching matrix according to claim 1, wherein said switch regions are triode triacs.

7. A switching matrix according to claim 1, wherein said switch regions are tetrode triacs.

8. A switching matrix according to claim 1, wherein said switch regions are pentode triacs.

9. A low crosstalk type switching matrix of monolithic semiconductor device having a plurality of lateral type PNPN type switching elements arranged in matrix fashion, comprising:
    a double layered substrate (11) including in its entirety a first P+ type layer (24) having high impurity concentration and a second P type layer (26) having low impurity concentration, said first and second layers being layered one upon another;
    a third N type layer (14) having low impurity concentration formed on said second P type layer (26) in order to form said switching elements;
    buried N+ type layers (12) having high impurity concentration formed at the junction between said second P type layer (26) and said third N type layer (14) at respective crosspoints of the matrix;
    thyristor structures (14, 18, 20, 22) including an anode gate N type region (14) formed in said third N type layer (14) over said buried N+ type layers (12), an anode P type region (18) and a cathode gate P type region (20) both of which are separately formed from the surface of said anode gate N type region (14) toward the inner portion thereof, and a cathode N+ type region (22) having high impurity concentration formed from the surface of said cathode gate P type region (20) toward the inner portion thereof;
    isolation P+ type regions (28) formed in said third N type layer (14) enclosing each of said thyristor structures so as to contact said second P type layer (26) but not to contact said buried N+ type layers, said isolation P+ type regions (28) having outer peripheries;
    separation N type regions (30) having low impurity concentration of said third N type layer (14) and which form a separation distance ($l_2$) of about 10 microns between the outer peripheries of said isolation P+ type regions;
    a parasitic PNP type transistor (42) being formed by said anode P type region (18), said gate N type region (14), said second P type layer (26) and said isolation P+ type region (28);
    compensation N+ type regions (32) having high impurity concentration contacting said buried N+ type layers (12) and enclosing said thyristor structures but being inside said isolation P+ type regions (28) in said third N type layer (14), in order to reduce the current amplification factor of said parasitic PNP type transistor (42); and
    N type regions (34) of said third N type layer (14) formed between said compensation N+ type regions (32) and said isolation P+ type regions (28), in order to improve the withstand voltage between said gate N type regions (14) and said isolation P+ type regions (28).

10. A low crosstalk type switching matrix of monolithic semiconductor device having a plurality of lateral type PNPN type switching elements arranged in a matrix, comprising:
- a double layered substrate (11) including in its entirety a first P+ type layer (24) having high impurity concentration, said first and second layers being layered one upon another;
- a third N type layer (14) having low impurity concentration formed on said second P type layer (26) in order to form said switching elements;
- buried N+ type layers (12) having high impurity concentration formed at the junction between said second P type layer (26) and said third N type layer (14) at respective crosspoints of the matrix;
- triac structures formed by a gate N type region (14) formed in said third N type layer (14) over said buried N+ type layers (12), a first gate P type region (18) and a second gate P type region (20) both of which have low impurity concentration and are separately formed from the surface of said gate N type region (14) toward the inner portions thereof, and first and second N+ type regions (56, 22) both of which have high impurity concentration and are formed from the surface of said first and second gate P type regions (18, 20) toward the inner portions thereof;
- isolation P+ type regions (28) formed in said third N type layer (14) enclosing each of said triac structures so as to contact said second P type layer (26) but not to contact said buried N+ type layers, said isolation P+ type regions having outer peripheries;
- separation N type regions (34) having low impurity concentration of said third N type layer (14) and which form a separation distance ($l_2$) of about 10 microns between the outer peripheries of said isolation P+ type regions (28);
- a parasitic PNP type transistor formed by said first and second gate P type regions (18,20), said gate N type region (14), said second P type layer (26) and said isolation P+ type region (28);
- compensation N+ type regions (32) having high impurity concentration contacting said buried N+ type layers and enclosing said triac structures but being inside said isolation P+ type regions in said third N type layer (14), in order to reduce the current amplification factor of said parasitic PNP type transistor; and
- N type regions (34) of said third N type layer (14) formed between said compensation N+ type regions (32) and said isolation P+ type regions (28), in order to improve the withstand voltage between said gate N type regions (14) and said isolation P+ type regions (28).

11. A switching matrix according to claim 1 wherein said separation regions (30) have a higher resistivity than said double layered substrate (11).

12. A switching matrix according to claim 9 wherein said double layered substrate 11 has a low resistivity, and said separation regions (30) have a high resistivity.

13. A switching matrix according to claim 10 wherein said double layered substrate 11 has a low resistivity, and said separation regions (30) have a high resistivity.

* * * * *